(12) United States Patent
Smith et al.

(10) Patent No.: US 9,091,941 B2
(45) Date of Patent: Jul. 28, 2015

(54) FAST ILLUMINATION SIMULATOR BASED ON A CALIBRATED FLEXIBLE POINT-SPREAD FUNCTION

(71) Applicant: NIKON CORPORATION, Tokyo (JP)

(72) Inventors: Daniel Gene Smith, Tucson, AZ (US); Donis G. Flagello, Half Moon Bay, CA (US)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/242,571

(22) Filed: Apr. 1, 2014

(65) Prior Publication Data

US 2014/0211186 A1 Jul. 31, 2014

Related U.S. Application Data

(63) Continuation of application No. 13/399,950, filed on Feb. 17, 2012, now abandoned.

(60) Provisional application No. 61/444,976, filed on Feb. 21, 2011, provisional application No. 61/464,166, filed on Feb. 28, 2011.

(51) Int. Cl.
*G03B 27/80* (2006.01)
*G03B 27/54* (2006.01)
*G03F 7/20* (2006.01)

(52) U.S. Cl.
CPC .............. *G03F 7/7055* (2013.01); *G03F 7/705* (2013.01); *G03F 7/70083* (2013.01)

(58) Field of Classification Search
CPC ................................ G03F 7/20; G03F 7/70091
USPC ............. 355/52, 53, 55, 67–71; 356/399–401
See application file for complete search history.

(56) References Cited

U.S. PATENT DOCUMENTS

| | | | |
|---|---|---|---|
| 6,052,626 A | 4/2000 | Inui | |
| 6,738,859 B2 | 5/2004 | Liebchen | |
| 6,900,915 B2 | 5/2005 | Nanjyo et al. | |
| 7,095,546 B2 | 8/2006 | Mala et al. | |
| 7,283,209 B2 | 10/2007 | Brotsack | |
| 8,305,560 B2 | 11/2012 | Minoda | |
| 8,321,815 B2 | 11/2012 | Yamazoe et al. | |
| 8,467,033 B2 * | 6/2013 | Natt et al. | 355/67 |
| 2006/0170901 A1 | 8/2006 | Tanitsu et al. | |
| 2006/0203214 A1 | 9/2006 | Shiraishi | |
| 2007/0146676 A1 | 6/2007 | Tanitsu et al. | |
| 2007/0296936 A1 | 12/2007 | Kato et al. | |
| 2009/0075216 A1 * | 3/2009 | Kawakami | 430/322 |
| 2010/0039636 A1 | 2/2010 | Fiolka | |
| 2011/0310375 A1 | 12/2011 | Shigematsu | |

FOREIGN PATENT DOCUMENTS

| | | |
|---|---|---|
| EP | 0779530 A1 | 6/1997 |
| WO | 9949504 | 9/1999 |

\* cited by examiner

*Primary Examiner* — Hung Henry Nguyen
(74) *Attorney, Agent, or Firm* — Yakov Sidorin; Quarles & Brady LLP (57) ABSTRACT

Method of predicting a distribution of light in an illumination pupil of an illumination system includes identifying component(s) of the illumination system the adjustment of which affects this distribution and simulating the distribution based on a point spread function defined in part by the identified components. The point spread function has functional relationship with configurable setting of the illumination settings.

20 Claims, 5 Drawing Sheets

FAST ILLUMINATION SIMULATOR BASED ON A CALIBRATED FLEXIBLE POINT-SPREAD FUNCTION

RELATED APPLICATIONS/CLAIM OF PRIORITY

This application in a continuation from the U.S. patent application Ser. No. 13/399,950 filed on Feb. 17, 2012, now abandoned, which in turn is related to and claims priority from provisional application Ser. No. 61/444,976, filed Feb. 21, 2011, and from provisional application Ser. No. 61/464,166, filed Feb. 28, 2011. The disclosure of each of the above-mentioned patent applications is incorporated by reference herein in its entirety.

INTRODUCTION

As the resolution of optical lithographic projection system tools at 193 nm immersion, applicants have found that reliance on specially designed and/or tightly constrained illumination pupil patterns can be significant. Applicants believe it is preferable not to rely on simple models of quadrupole or annular illumination.

Applicants recognize that one option is to use a raytraceable model of the entire illumination optical system to simulate the propagation of light from laser to reticle. Such a model is very useful for producing highly accurate and realistic pupil patterns of any desired shape, but can take a very large number of rays and thus require a great deal of CPU time.

Applicants also recognize that other algorithms produce simulated illumination pupils very quickly by fitting parametric models of several standard illumination pupil shapes. These parametric models typically consist of error functions, exponentials and other assorted closed forms chosen by the clever designer to produce good fits across the expected dynamic range. Such models usually have to be redesigned for each new illumination pupil shape, so although the results can be accurate and fast, lack of flexibility for free-form illumination is an issue.

In some applications, such as source optimization (SO) or source mask optimization (SMO), it is highly desirable to have a simulation method that is fast, flexible and accurate. Additionally, it's nice to have an algorithm that is also based on the physical mechanisms involved so that we can understand what is going on and have some ability to predict its behavior and range of applicability.

Thus, applicants have recognized the desirability of providing an improved way to predict the illumination pupil for an illumination system that has any adjustability (e.g. in component(s) of the system, such as the axicon or zoom lens of an ArF lithography system) that can affect the distribution of light in the illumination pupil.

SUMMARY

The present invention provides a method of predicting distribution of light in an illumination pupil of an illumination system in which one or more adjustable components affect the distribution of light in the illumination pupil. The method comprises:

a. identifying one or more component(s) of an illumination system having an illumination pupil, where the component(s) affect the distribution of light in the illumination pupil;

b. generating a point spread function that depends on the identified component(s) and has a functional relationship with the configurable settings of the illumination system; and c. predicting the distribution of light in the illumination pupil using the point spread function.

Thus, applicants solution to the problem involves identifying component(s) of the illumination system that can affect the distribution of light in the illumination pupil, and provide a simulation of the distribution of light in the illumination pupil, by applying, as part of the simulation, a point spread function that depends on the component(s) that can affect the distribution of the light in the illumination pupil.

The principles of the present invention are particularly applicable to an illumination system for an optical lithographic projection system, especially an immersion lithography system with an argon fluoride (ArF) laser light source that generates light at a wavelength of 193 nm.

Further features of the present invention will become apparent from the following detailed description and the accompanying drawings.

DETAILED DESCRIPTION

As described above, applicants have recognized the desirability of providing an improved way to predict the illumination pupil for an illumination system that has component(s) such as an axicon pair, micromirror array and/or zoom lens that can affect the distribution of light in the illumination pupil.

Figure 1:
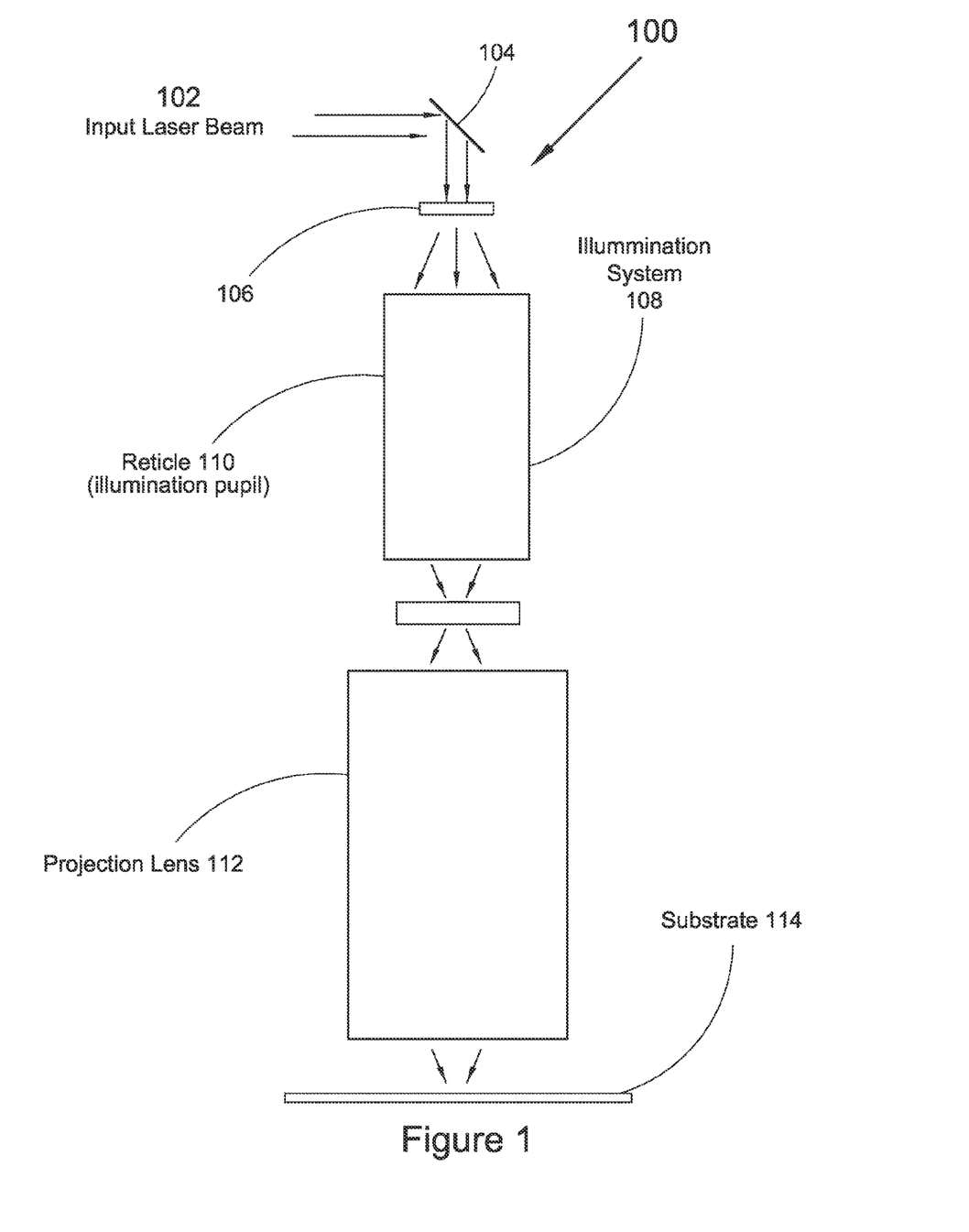
FIG. 1 is a schematic illustration of the basic components of an immersion lithographic imaging system, with which the present invention is useful.

FIG. 1 is a schematic illustration of such an ArF immersion lithography system 100, with an illumination system with which the present invention can be used. The system 100 receives light from a light source 102, e.g. an ArF laser beam with a wavelength at 193 nm. The system 100 comprises a fold mirror 104 that bends the beam from the light source, a scattering element 106, an illumination system 108 with which the method of the present invention can be used, a reticle 110 that is illuminated by the illumination system 108 (where the illumination pupil of the illumination system can be thought of as the angles of the rays (or plane waves) that are incident on the reticle 110), a projection lens 112 that projects an image of the reticle to a substrate 114. The projection of the image from the projection lens 112 to the substrate 114 is through a fluid (preferably liquid) medium; hence the system is generally referred to as an "immersion lithography" system. The image projected to the substrate 114 is transmitted to a resist that is used in developing an electronic circuit on the substrate, e.g. in the formation of a semi conductor wafer.

The present invention relates to the illumination system 108 and to a method by which the illumination system can be characterized, so that its ultimate construction can be as useful as possible. The remaining parts of the system of FIG. 1 are generally known and should not require further explanation to those in the art.

Figure 2:
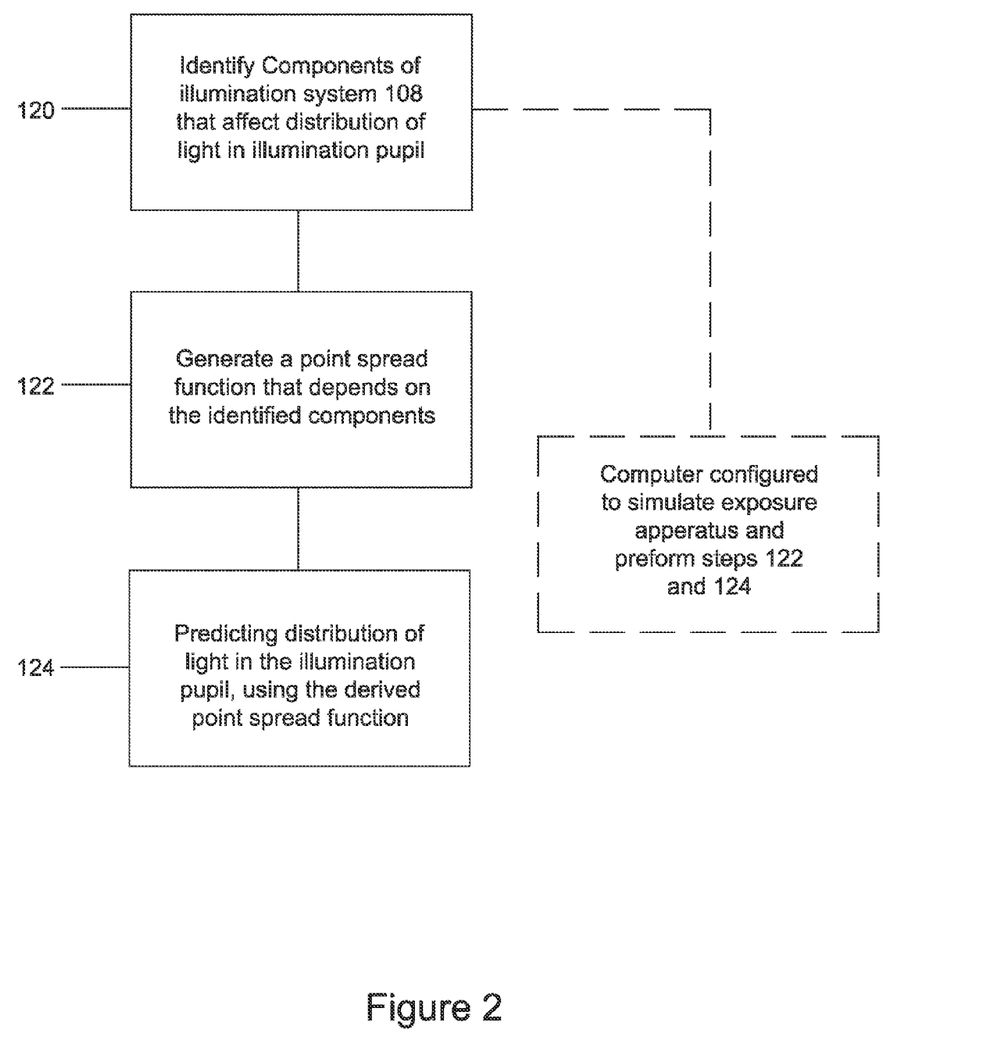
FIG. 2 is a schematic illustration of the steps in a method according to the present invention.
Figure 3:
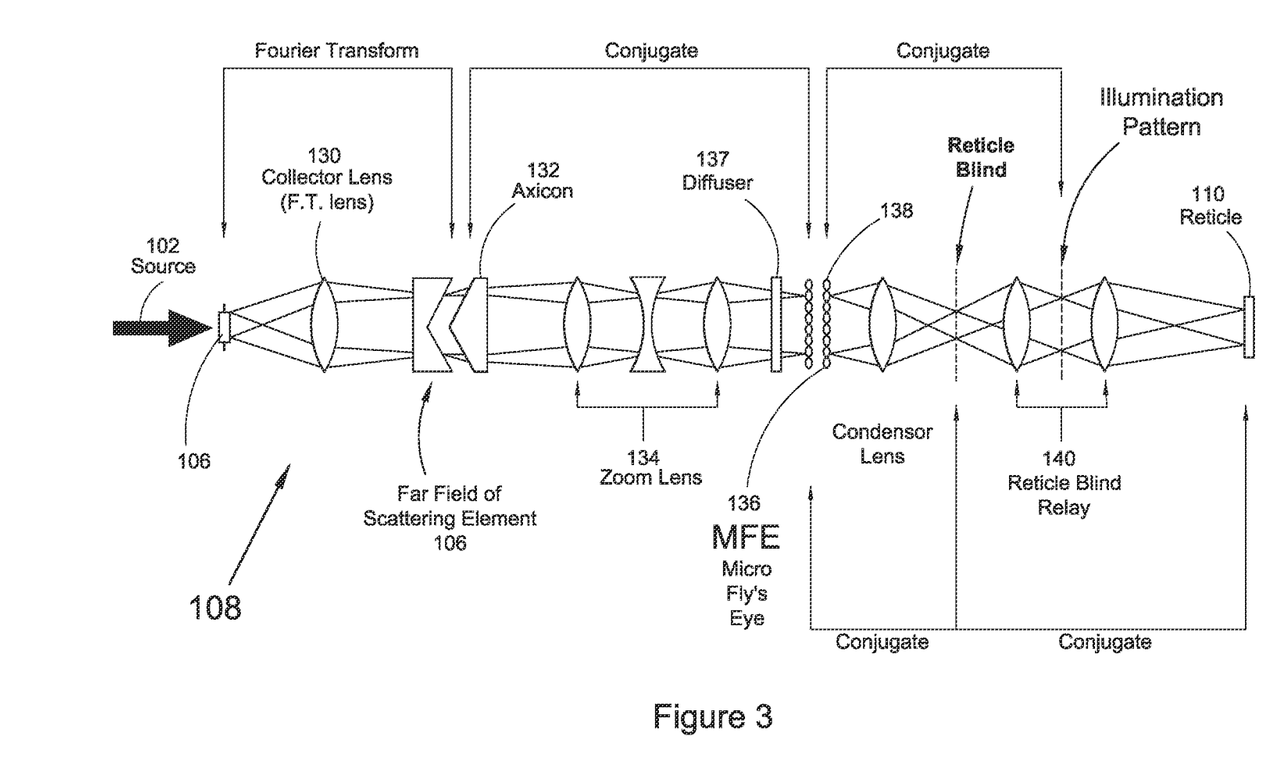
FIG. 3 is a schematic illustration of the basic components of one version of an illumination system in accordance with one example of the present invention.

FIG. 2 shows schematically the method of the present invention, and FIG. 3 shows one example of an illumination system that implements the present invention.

Also, as described above, the present invention provides predicting distribution of light in an illumination pupil of an illumination system in which one or more components affect the distribution of light in the illumination pupil. As schematically illustrated in FIG. 2, the method comprises:

a. Step 120—identifying one or more component(s) of an illumination system having an illumination pupil, where the component(s) affect the distribution of light in the illumination pupil;
b. step 122—generating a point spread function that depends on the identified component(s) and has a functional relationship with the configurable settings of the illumination system; and
c. Step 124—predicting the distribution of light in the illumination pupil using the point spread function.

Thus, applicants' solution to the problem involves identifying component(s) of the illumination system that can affect the distribution of light in the illumination pupil, and provide a simulation of the distribution of light in the illumination pupil, by applying as part of the simulation a point spread function that depends the component(s) whose adjustability that can affect the distribution of the light in the illumination pupil.

In implementing applicants' invention, it is initially noted that the basic idea behind this invention of a fast, flexible and accurate illuminator simulation is to use knowledge of the optical system to derive a point spread function that can include the effects of the various blurring mechanisms involved.

The derived point spread function can then be applied in an overlap integral that describes the transfer from the far field of a diffracting/scattering component 106 to the incident far field at the reticle, which is also the entrance of the illumination pupil. This operation can be described mathematically by equation 1.

$$A_{reticle}(x_{mn},y_{mn}) \approx \Sigma_i \Sigma_j A_s(\alpha_{ij},\beta_{ij}) \text{psf}(x_{mn},y_{mn},\alpha_{ij},\beta_{ij}; IU_{setting}) \quad (1)$$

Where the far field distribution of the diffracting/scattering element is represented by $A_s$ and is a function of the entrance pupil coordinates $\alpha_{i,j}$ and $\beta_{i,j}$. The subscripts are a consequence of the discrete (rather than continuous) sum across the two dimensional array of pixels in the pupil—each pixel (i,j) has a pair of pupil coordinates $(\alpha,\beta)$.

The distribution in the exit pupil of the illuminator, or the incident far field at the reticle, is then $A_{reticle}$, a function of the exit pupil coordinates $(x_{i,j}, y_{i,j})$. The point spread function PSF is then a function of both coordinate systems and also depends on the unspecified parameters contained in $IU_{setting}$, which can be an array of values that determine the adjustable parameters of the illumination system.

In the case that the point spread function depends only on the difference between entrance and exit pupil coordinates, the integration/sum becomes a convolution and would allow for the use of various linear system techniques. This is seldom the case and so we choose to use this form of overlap calculation.

As will become apparent, the specific form of the point spread function depends on the illumination system being modeled, and more generally on the type of components included in that system. The system described in FIG. 3, as an example, uses a laser to illuminate a scattering element 106. A collector lens 130 following the scattering element 106 transfers the scattered beam to a pair of axicon elements 132 near the Fourier transform plane of the scattering element 106 (thus the collector lens is referred to as a Fourier Transform optic). The axicon pair 132, regarded as an annular ratio changing optics, are composed of a concave and convex axicon that, when separated by some distance, act to shift the scattering element far-field distribution radially by a constant radial magnitude (rather than a simple magnification). The beam leaving the axicon pair 132 is relayed to a set of fly's eye elements 136 by a zoom lens 134 and a diffuser 137 (which can be located before or after the fly's eye elements 136. The image from the fly's eyes elements 136 are relayed to the reticle 110 by condensor lens 138 and a reticle blind relay 140. The fly's eye elements 136 act to produce a rectangular illumination pattern on the reticle 110 while the diffuser 137 acts to blur the illumination pattern. The diffuser 137 is optional. The configuration and action of the illumination system of this type are disclosed, for example, in U.S. Patent Application Laid-Open No. 2011/0310375 A1. It is possible to apply the present embodiment to other appropriate illumination system, e.g. an illumination system disclosed in U.S. Patent Application Laid-Open No. 2010/039636A1. The disclosures of above U.S. Patent Application Laid-Open Nos. 2011/0310375A1 and 2010/039636A1 are incorporated herein by reference.

One of the most problematic aspects of modeling a system like this are the aberrations introduced by the axicon pair, which tend to be a very high order astigmatism/coma aberration, and any parametric model will have to include this effect. To construct a useful point spread function it is convenient to consider the various significant contributors to the shape and size of the blur. In the system of FIG. 3, the axicon pair 132 and the zoom lens 134 have a strong effect, and the relay lens and condenser lens have a relatively small effect.

In positions where the axicon and lenses do not significantly distort the point spread function, the size and shape of the blur can be dominated by the scattering effects of the diffuser. When this is not the case, the fly's eye lenslet array 136 will affect the shape of the pupil by superimposing a grid like intensity distribution—however this is not the case in the system described here.

In places where the aberrations of the axicon dominate, and in the absence of the diffuser, the effect is to produce a crescent shaped point spread function that has high intensity near the center and falls off slowly along the length of the crecent, droping to zero rather abruptly at the ends of the crescent. The shape of the crescent is invariant with respect to the optical axis (like coma or astigmatism of a rotationally symmetric lens system).

At a given point in the pupil and for a specific setting of the illumination system we can express the effects of the crescent shaped axicon aberrations and the diffuser as a convolution between the diffuser point spread function and the profile of the intensity along the crescent with its center of curvature at the center of the pupil. The following form assumes that the crescent intensity falls off like a Gaussian, and that the diffuser point spread function is a rotationally symmetric Gaussian.

$$psf(x,y) = \frac{1}{\text{Erf}\left[\frac{\Delta\theta/2}{\sqrt{2}\,b}\right]} \qquad (2)$$

$$\int_{\theta_0-\Delta\theta/2}^{\theta_0+\Delta\theta/2} \frac{1}{\sqrt{2\pi}\,b} e^{-\frac{(\theta'-\theta_0)^2}{2b^2}} \frac{1}{2\pi\sigma^2} e^{-\frac{1}{2\sigma^2}[(x-r_0\cos\theta')^2+(y-r_0\sin\theta')^2]} d\theta'$$

Where $(r_0, \theta_0)$ is the position of the center of the crescent in polar coordinates, b is the width parameter of the diffuser spread function (standard deviation), and $\sigma$ is the shape parameter of the crescent, while $\Delta\theta$ is the full width of the crescent.

The leading factor in equation (2), with an error function in the denominator, is an additional normalization that makes the area under the crescent profile unity (see equation 3), which has finite support, so that the volume under the convolution is also unity.

$$\int_{-\Delta\theta/2}^{\Delta\theta/2} \frac{1}{\sqrt{2\pi}\,b} e^{-\frac{\theta^2}{2b^2}} d\theta = \text{Erf}\left[\frac{\Delta\theta/2}{\sqrt{2}\,b}\right] \qquad (3)$$

If we complete the square and make the small angle approximation for $\Delta\theta$, equation (2) simplifies to equation (4).

$$psf(x,y) = \frac{1}{\text{Erf}\left[\frac{\Delta\theta/2}{\sqrt{2}\,b}\right]} \int_{\theta_0-\frac{\Delta\theta}{2}}^{\theta_0+\frac{\Delta\theta}{2}} \frac{1}{\sqrt{2\pi}\,b} e^{-\frac{(\theta-\theta_0)^2}{2b^2}} \qquad (4)$$

$$\frac{1}{2\pi\sigma^2} e^{-\frac{1}{2\sigma^2}[(r\cos\theta-r_0\cos\theta')^2+(r\sin\theta-r_0\sin\theta')^2]} d\theta'$$

$$\approx \frac{1}{\text{Erf}\left[\frac{\Delta\theta/2}{\sqrt{2}\,b}\right]} \times \frac{1}{\sqrt{2\pi}\,\sigma} e^{-\frac{(r-r_0)^2}{2\sigma^2}} \times \frac{1}{\sqrt{2\pi}\,\sigma_\theta} e^{-\frac{(\theta-\theta_0)^2}{2\sigma^2}} \times$$

$$\frac{1}{2\sqrt{rr_0}} \left\{ \text{Erf}\left[\frac{\frac{b}{\sigma/\sqrt{rr_0}}\left(\frac{\Delta\theta}{2}+\theta-\theta_0\right)+\frac{\sigma/\sqrt{rr_0}\,\Delta\theta}{b2}}{2\sigma_\theta}\right] + \right.$$

$$\left. \text{Erf}\left[\frac{\frac{b}{\sigma/\sqrt{rr_0}}\left(\frac{\Delta\theta}{2}-\theta+\theta_0\right)+\frac{\sigma/\sqrt{rr_0}\,\Delta\theta}{b2}}{2\sigma_\theta}\right] \right\}$$

Where we have defined the new quantity, $\sigma_\theta$.

$$\sigma_\theta = \sqrt{b^2 + \sigma^2/rr_0} \qquad (5)$$

The form of the PSF in equation (4) has three shape parameters, $r_0$, b and $\Delta\theta$. These three parameters are in turn functions of the pupil position and the settings of the illuminator.

One way to determine the shape parameters of the point spread function is to measure the experimental point spread function, for many points in the entrance pupil and for many different illuminator settings, and then perform a regression analysis. Another approach is to perform the regression analysis on simulated point spread functions—simulated by raytracing for example. These techniques are different from the concept of the present invention.

Specifically, one apparent difference between a raytraced point spread function and the regression model of equation 4 (according to the present invention), is that the centers of curvature of crescents are apparently not in the same location; the center of curvature of the raytraced PSF is somewhere between the optical axis and the crescent itself. This is due to the—behavior of the axicon, which is designed to shift the point spread function away from the optical axis. In any case, it is reasonable to modify the PSF of equation (4) to include this behavior, and this can be done by including a new parameter $\delta r$ and replacing the coordinate r with r' of equation (6). The resulting difference between fit and simulation, when this parameter is included in the regression model, illustrates that the difference in curvature has been effectively reduced.

$$r' = \delta r + \sqrt{r^2 + \delta r^2 - 2r\delta r\cos[\theta-\theta_0]} \qquad (6)$$

The foregoing discussion surrounding applies to the fit of the PSF to a single point in the pupil of a single configuration of the illuminator. To be usefully applied to equation (1), the PSF should be a function of position in the pupil and illuminator configuration parameters. In this discussion, the only configuration parameters are the spacing a between the axicons of the axicon pair, and the zoom lens focal length, F. In general, each of the parameters of the PSF of equations (4) and (6), A, b, $r_0$, $\theta_0$, $\delta r$, $\Delta\theta$, are functions of the illuminator settings a and F, as well as the entrance pupil coordinates $\rho$ and $\theta$. In practice we can often consider the system to be rotationally symmetric so that angles about the optical axis are preserved between entrance and exit pupil and so the parameter $\theta_0$, can be dropped from the regression, and we can expect all of the other parameters to be independent of $\theta$. Furthermore the parameter $\delta r$ does not usually have a big impact on the accuracy of the model for this system.

Determination of A, b, $r_0$, $\Delta\theta$, depend on a, F and $\rho$ can be determined with standard regression techniques, and in some special cases, we can derive very reasonable approximate relationships from first principles, but the preferred approach is to design a polynomial regression model and determine the parameters of the regression either by comparison with experimental data, or with simulated point spread functions—simulated by raytracing for example. Equation (7) describes a complete regression model, and FIG. 4 describes a set of parameters that resulted from one fit to simulated point spread functions.

$$psf(x,y) \approx \frac{1}{\text{Erf}\left[\frac{\Delta\theta/2}{\sqrt{2}\,b}\right]} \times \frac{1}{\sqrt{2\pi}\,\sigma} e^{-\frac{(r-r_0)^2}{2\sigma^2}} \times \frac{1}{\sqrt{2\pi}\,\sigma_\theta} e^{-\frac{(\theta-\theta_0)^2}{2\sigma^2}} \times \qquad (7)$$

$$\frac{1}{2\sqrt{r\,r_0}} \left\{ \text{Erf}\left[\frac{\frac{b}{\sigma/\sqrt{rr_0}}\left(\frac{\Delta\theta}{2}+\theta-\theta_0\right)+\frac{\sigma/\sqrt{rr_0}\,\Delta\theta}{b2}}{2\sigma_\theta}\right] + \right.$$

$$\left. \text{Erf}\left[\frac{\frac{b}{\sigma/\sqrt{rr_0}}\left(\frac{\Delta\theta}{2}-\theta+\theta_0\right)+\frac{\sigma/\sqrt{rr_0}\,\Delta\theta}{b2}}{2\sigma_\theta}\right] \right\}$$

$$\sigma_\theta = \sqrt{b^2 + \sigma^2/rr_0}$$

$$r_0 = c_0 + c_1 F + c_2 aF + c_3 \rho F$$

$$\Delta\theta = c_4 + c_5 \frac{a}{\rho} + c_6 \frac{a}{\rho} \cdot \frac{1}{F} + c_7 \left(\frac{a}{\rho}\right)^2 \frac{1}{F} + c_8 \left(\frac{a}{\rho}\right)^2 \left(\frac{1}{F}\right)^2$$

$$A = c_9 + c_{10} a^2 F^2 + c_{11} a\rho F^2 + c_{12} \rho^2 F^2$$

-continued $b =$ constant $\sigma =$ constant

Thus, the foregoing detailed description shows how the principles of the present invention can be used in an illumination system of an optical lithographic imaging system to predict distribution of light in an illumination pupil of the illumination system, where one or more adjustable components affect the distribution of light in the illumination pupil, by:

a. identifying one or more component(s) of an illumination system having an illumination pupil, where the component(s) affect the distribution of light in the illumination pupil [in the example of FIG. 3, those components are the axicon pair 132 and the zoom lens 134, and may also include the diffuser];

b. generating a point spread function that depends on the identified component(s)[in the example of FIG. 3 and has a functional relationship with the configurable settings of the illumination system, the generation of the point spread function is shown by equation 4]; and c. predicting the distribution of light in the illumination pupil using the point spread function [in the example of FIG. 3, prediction of the distribution of light is shown by equation 1].

Figure 4:
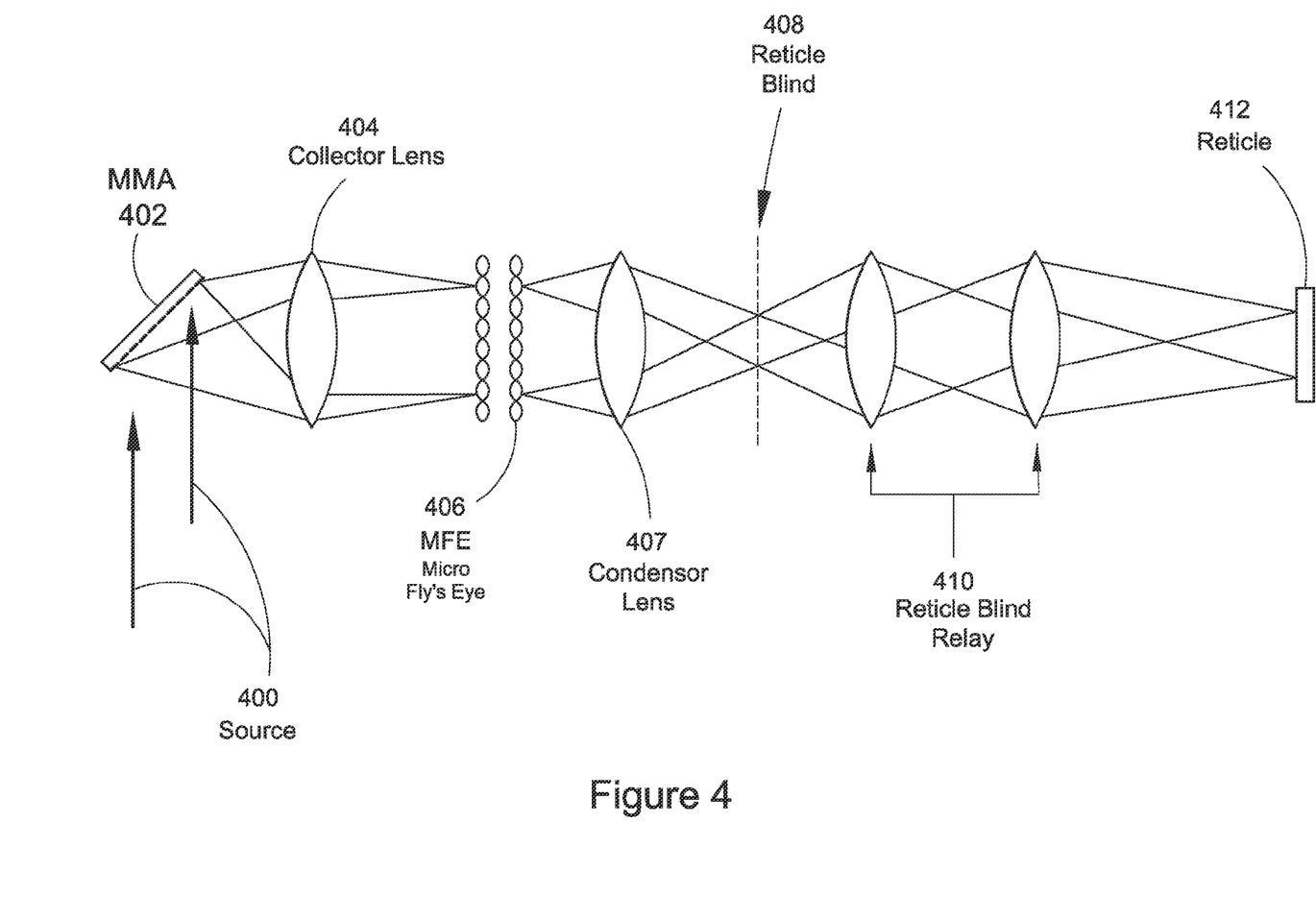
FIG. 4 is a schematic illustration of the basic components of another version of an illumination system in accordance with one example of the present invention.
Figure 5:
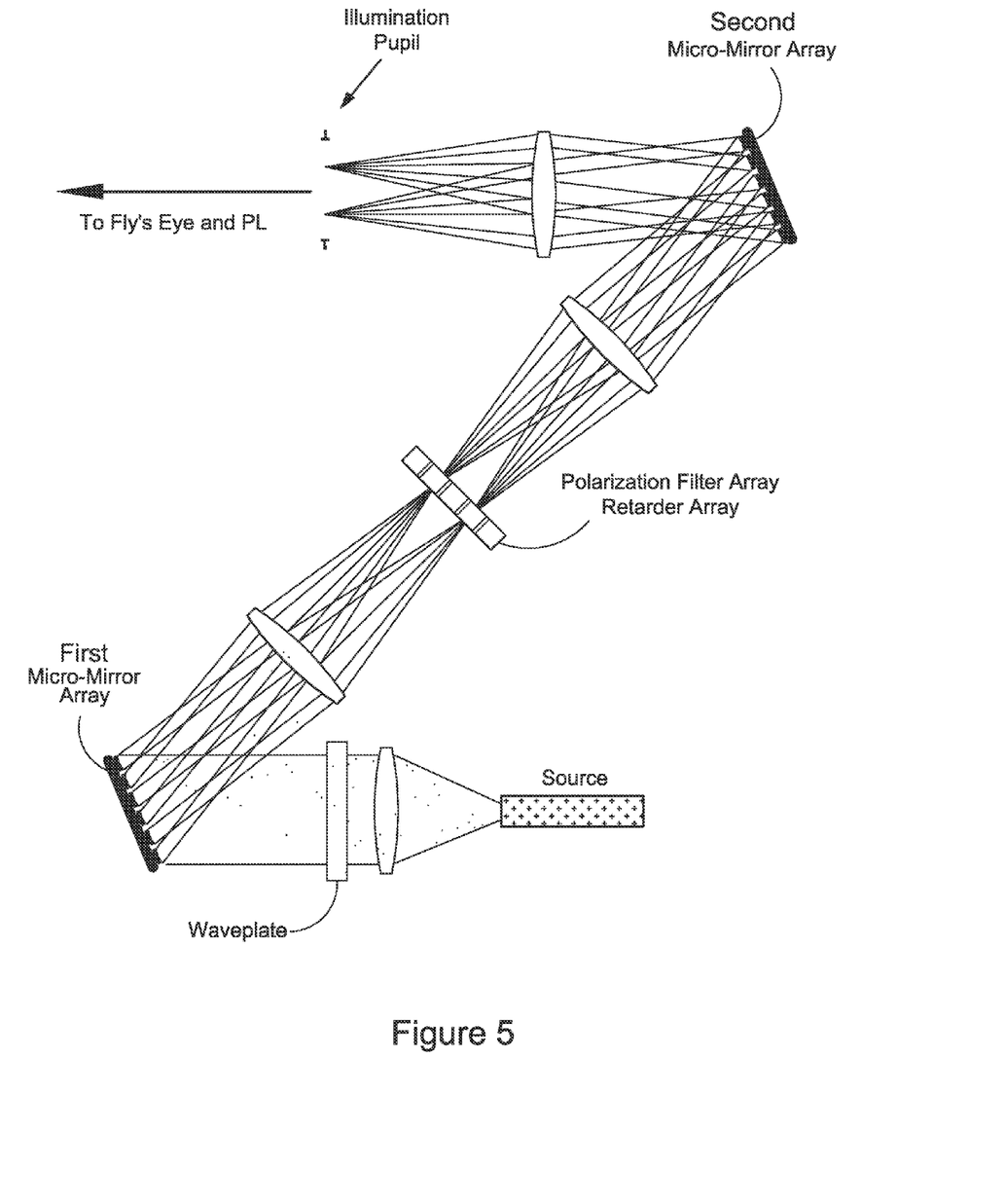
FIG. 5 is a schematic illustration of a modified micromirror array (MMA) for the system of FIG. 4.

FIGS. 4 and 5 provide schematic illustrations of the basic components of another version of an illumination system in accordance with one example of the present invention. In the system of FIG. 4, light from a source 400 is directed to a micromirror array (MMA) 402. The light is directed by a collector lens 404 to a micro fly's eye lenslet array 406, and then to a reticle 412 by a collector lens 407 (where the illumination pupil of the illumination system can be thought of as the angles of the rays (or plane waves) that are incident on the reticle 412), a reticle blind 408 and a relay 410. In the system of FIG. 4, the elements that can affect the distribution of light in the illumination pupil are the micromirror array 402 and possibly the a micro fly's eye lenslet array 406. The generation of the point spread function and the use of the point spread function to predict the distribution of light in the illumination pupil would be according to the principles described above in connection with the system of FIG. 3.

It should be noted that in the system of FIG. 4, the micromirror array 402 can comprise two micromirror arrays that are made conjugate with an intervening relay system, and that implementation is shown in FIG. 5. The implementation shown in FIG. 5 is designed to insure that the light leaving an element of the first MMA will always arrive at an element of the second. In this configuration (FIG. 5) two mirrors can be used to determine the position of every spot in the illumination pupil, and allow finer control over the polarization. In addition, in the implementation of FIG. 5, the polarization control is achieved by directing mirrors of the first array to an array of polarization filters, retarders, or polarization rotator. Then the second array, which is nominally conjugate to the first, is used to produce the desired distribution of polarization in the illumination pupil. Although FIG. 5 indicates that the two arrays have the same number of elements, this is not entirely necessary. It may be advantageous to use many fewer elements in the first array.

With the implementation of FIG. 5, the first MMA directs portions of polarized light to an array of polarization filters (e.g. retarders, which may also be reflective). The light leaving each polarization filter is then a different polarization. The second MMA, conjugate to the first, can then distribute the different polarizations within the pupil as desired. With this implementation, the first MMA could have many fewer elements than the second MMA, and the ratio of power between polarizations is practically unlimited. The polarization would be uniform in the space between the first MMA and the polarization filter array, and conversion of the polarization would occur at the polarization filter array. The second MMA can also be configured to provide finer control of the polarization in the illumination pupil.

With the implementation of FIG. 5, the first MMA directs portions of the beam to various polarization elements in the far-field of the array, with the (possible) assistance of a lens. Then another lens can re-image the first MMA onto the second MMA, so that each element in the second MMA has a well defined polarization state that it can direct to an arbitrary position in the illumination pupil.

The MMA applicable herein can be selected, for example, from those disclosed in European Patent Publication EP 779530A, U.S. Pat. No. 6,900,915, and U.S. Pat. No. 7,095,546. European Patent Publication EP 779530A, U.S. Pat. No. 6,900,915 and U.S. Pat. No. 7,095,546 are incorporated as references herein.

In the aforementioned embodiment, the mask can be replaced with a variable pattern forming device which forms a predetermined pattern on the basis of predetermined electronic data. Use of such a variable pattern forming device can minimize influence on synchronization accuracy even when the pattern surface is vertical. The variable pattern forming device applicable herein can be, for example, a MMA (Micro Mirror Array) including a plurality of reflective elements driven based on predetermined electronic data. The exposure apparatus with the MMA is disclosed, for example, in U.S. Patent Application No. 2007/0296936. Besides the reflective spatial light modulators of the non-emission type like the MMA, it is also possible to use a transmissive spatial light modulator or a self-emission type image display device.

In the foregoing embodiment, it is also possible to apply the so-called liquid immersion method, which is a technique of filling a medium (typically, a liquid) with a refractive index larger than 1.1 in the optical path between the projection optical system and the photosensitive substrate. In this case, the technique of filling the liquid in the optical path between the projection optical system and the photosensitive substrate can be selected from the technique of locally filling the liquid as disclosed in PCT International Publication No. WO99/49504, the technique of moving a stage holding a substrate as an exposure target in a liquid bath as disclosed in Japanese Patent Application Laid-Open No. 6-124873, the technique of forming a liquid bath in a predetermined depth on a stage and holding the substrate therein as disclosed in Japanese Patent Application Laid-Open No. 10-303114, and so on. The PCT International Publication No. WO99/49504, Japanese Patent Application Laid-Open No. 6-124873, and Japanese Patent Application Laid-Open No. 10-303114 are incorporated herein by reference.

In the foregoing embodiment, it is also possible to apply the so-called polarized illumination method disclosed in U.S Pat. Published Application Nos. 2006/0203214, 2006/0170901, and 2007/0146676. Teachings of the U.S Pat. Published Application Nos. 2006/0203214, 2006/0170901, and 2007/0146676 are incorporated herein by reference.

The present invention is not limited to just the application to the exposure apparatus for manufacture of semiconductor devices, but can also be widely applied, for example, to the exposure apparatus for the liquid-crystal display devices formed on rectangular glass plates, or for display devices such as plasma displays, and the exposure apparatus for manufacture of various devices such as imaging devices (CCDs and others), micromachines, thin-film magnetic heads, and DNA chips. Furthermore, the present invention is also applicable to the exposure step (exposure apparatus) for manufacture of masks (photomasks, reticles, etc.) on which mask patterns of various devices are formed, by the photolithography process.

The above-described embodiment used the ArF excimer laser light (wavelength: 193 nm) as the exposure light, but, without having to be limited to this, the present invention can also be applied to any other appropriate laser light source, e.g., the KrF excimer laser light (wavelength: 248 nm), or an $F_2$ laser light source which supplies laser light at the wavelength of 157 nm.

Finally, it should be noted that certain of the process steps of the present invention can be executed with a computer. For example, a computer can be enabled to simulate an exposure apparatus which irradiates an illumination light and forms a pattern on an object, to predict the distribution of light in the illumination pupil of an illumination system. Once the component(s) of the illumination system that affect the distribution of light in the illumination pupil of the illumination system are identified, the computer can be configured to simulate an exposure apparatus which irradiates an illumination light and forms a pattern on an object, by (i) generating a point spread function that depends on the identified component(s) and has a functional relationship with the configurable settings of the illumination system; and (ii) predicting the distribution of light in the illumination pupil using the point spread function. This process is schematically shown in dashed lines in FIG. 2.

With the foregoing principles in mind the manner in which applicants method can be implemented in various illumination systems, by identifying component(s) of an illumination system that can affect the distribution of light in the illumination pupil, and provide a simulation of the distribution of light in the illumination pupil, by applying as part of the simulation a point spread function that depends on the component(s) that can affect the distribution of the light in the illumination pupil, will be clear to those in the art.

What is claimed is:

1. A method for obtaining a distribution of light at an illumination pupil of an illuminator, which illuminator is configured to distribute light from a light source at the illumination pupil via a distributing optical element, and which illuminator is configured to illuminate a target surface with the distributed light, the method comprising:
   preparing a far field distribution of the distributing optical element; and
   calculating the distribution of light at the illumination pupil with the use of a plurality of point spread functions of a partial optical system, which point spread functions represent a plurality of positions at the illumination pupil,
   wherein the partial optical system is positioned between the distributing optical element and the illumination pupil,
   wherein the evaluating the distribution of light at the illumination pupil is effectuated according to $A_{reticle}(x_{mn},y_{mn}) \approx \Sigma_i \Sigma_j A_s(\alpha_{ij},\beta_{ij}) \text{psf}(x_{mn},y_{mn},\alpha_{ij},\beta_{ij}, IU_{setting})$, wherein the far field distribution of light, corresponding to the distributing element configured to scatter light, is represented by As and is a function of coordinates $\alpha_{ij}$ and $\beta_{ij}$ of an entrance pupil of the illumination system, wherein subscripts i and j correspond to a discrete sum across a two dimensional array of pixels in the entrance pupil such that each pixel (i,j) has a pair of pupil coordinates $(\alpha, \beta)$,
   wherein a distribution of light in an exit pupil of the illumination system, corresponding to an optical far field incident at the reticle, is represented by $A_{reticle}$ which is a function of exit pupil coordinates $(x_{m,n}, y_{m,n})$,
   wherein psf represents a point spread function, and
   wherein $IU_{setting}$ includes an array of values that determine adjustable parameters of the illumination system.

2. The method of claim 1, wherein
   the calculating includes convolving the plurality of point spread functions and the far field distribution.

3. The method of claim 2, wherein
   the plurality of point spread functions that represent the plurality of positions expresses a function of a position in the illumination pupil.

4. The method of claim 1, further comprising:
   preparing the plurality of point spread functions of a partial optical system.

5. The method of claim 4, wherein
   the preparing the plurality of point spread functions includes measuring a distribution of light at the illumination pupil.

6. The method of claim 4, wherein
   the preparing the plurality of point spread functions includes simulating the partial optical system by ray tracing.

7. The method of claim 1, wherein
   the distributing optical element comprises at least one of a diffracting element, a scattering element, and a micro mirror array.

8. An illuminator that is configured to distribute light from a light source at an illumination pupil via a distributing optical element and that is configured to illuminate a target surface with light distributed at the illumination pupil, the illuminator comprising:
   a partial optical system arranged between the distributing optical element and the illumination pupil; and
   a pupil distribution calculator configured to calculate a distribution of light at the illumination pupil,
   wherein the pupil distribution calculator is configured to calculate the distribution of light at the illumination pupil using a far field distribution of the distributing optical element and a plurality of point spread functions of a partial optical system that represent a plurality of positions at the illumination pupil,
   wherein the pupil distribution calculator is configured to calculate the distribution of light at the illumination pupil according to $A_{reticle}(x_{mn},y_{mn}) \approx \Sigma_i \Sigma_j A_s(\alpha_{ij},\beta_{ij}) \text{psf}(x_{mn},y_{mn},\alpha_{ij},\beta_{ij}, IU_{setting})$, wherein the far field distribution of light, corresponding to the distributing optical element configured to scatter light, is represented by As and is a function of coordinates $\alpha_{ij}$ and $\beta_{ij}$ of an entrance pupil of the illumination system,
   wherein subscripts i and j correspond to a discrete sum across a two dimensional array of pixels in the entrance pupil such that each pixel (i,j) has a pair of pupil coordinates $(\alpha, \beta)$,
   wherein a distribution of light in an exit pupil of the illumination system, corresponding to an optical far field incident at the reticle, is represented by $A_{reticle}$, which is a function of exit pupil coordinates $(x_{m,n}, y_{m,n})$, wherein psf represents a point spread function, and wherein $IU_{setting}$ includes an array of values that determine adjustable parameters of the illumination system.

9. The illuminator of claim 8, wherein
the pupil distribution calculator is configured to convolve the plurality of point spread functions and the far field distribution.

10. The illuminator of claim 9, wherein
the plurality of point spread function representing the plurality of positions expresses a function of a position in the illumination pupil.

11. The illuminator of claim 8, wherein
the plurality of point spread functions is obtained by measuring a distribution of light at the illumination pupil.

12. The illuminator of claim 8, wherein
the plurality of point spread functions is obtained as a result of a ray tracing simulation of the partial optical system.

13. The illuminator of claim 8, wherein
the distributing optical element comprises at least one of a scattering element and a micro mirror array.

14. A process for enabling a computer to simulate a distribution of light at an illumination pupil of an illuminator, which illuminator is configured to distribute light from a light source at the illumination pupil via a distributing optical element, and which illuminator is configured to illuminate a target surface with light distributed at the illumination pupil, the process comprising:

forming a far field distribution of the distributing optical element; and calculating the distribution of light at the illumination pupil with the use of a plurality of point spread functions of a partial optical system, which plurality relates to a plurality of positions at the illumination pupil, wherein the partial optical system is positioned between the distributing optical element and the illumination pupil, wherein the calculating is effectuated according to $$A_{reticle}(x_{mn}, y_{mn}) \approx \Sigma_i \Sigma_j A_s(\alpha_{ij}, \beta_{ij}) \mathrm{psf}(x_{mn}, y_{mn}, \alpha_{ij}, \beta_{ij}, IU_{setting}),$$

wherein the far field distribution of light, which corresponds to a diffracting element that is configured to scatter light, is represented by $A_s$ and is a function of coordinates $\alpha_{ij}$ and $\beta_{ij}$ of an entrance pupil of the illumination system, wherein subscripts i and j correspond to a discrete sum across a two dimensional array of pixels in the entrance pupil such that each pixel (i,j) has a pair of pupil coordinates $(\alpha, \beta)$, wherein a distribution of light in an exit pupil of the illumination system, corresponding to an optical far field incident at the reticle, is represented by $A_{reticle}$, which is a function of exit pupil coordinates $x_{m,n}$, $y_{m,n}$), wherein psf represents a point spread function, and wherein $IU_{setting}$ includes an array of values that determine adjustable parameters of the illumination system.

15. The process of claim 14, wherein
the calculating including convolving the plurality of point spread functions and the far field distribution.

16. The process of claim 15, wherein
the plurality of point spread functions expresses a function of a position in the illumination pupil.

17. The process of claim 14, further comprising:
determining the plurality of point spread functions of the partial optical system.

18. The process of claim 17, wherein
the determining the plurality of point spread functions includes measuring a distribution of light at the illumination pupil.

19. The process of claim 17, wherein
the determining the plurality of point spread functions includes simulating the partial optical system by ray tracing.

20. The process of claim 14, wherein
the distributing optical element comprises at least one of a diffracting element, a scattering element and a micro mirror array.

* * * * *